United States Patent
Mun et al.

(10) Patent No.: US 11,869,906 B2
(45) Date of Patent: Jan. 9, 2024

(54) IMAGE SENSOR WITH ELEVATED FLOATING DIFFUSION

(71) Applicant: OmniVision Technologies, Inc., Santa Clara, CA (US)

(72) Inventors: Seong Yeol Mun, Santa Clara, CA (US); Heesoo Kang, Cupertino, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 481 days.

(21) Appl. No.: 16/946,743

(22) Filed: Jul. 2, 2020

(65) Prior Publication Data

US 2022/0005846 A1 Jan. 6, 2022

(51) Int. Cl.
*H01L 27/146* (2006.01)

(52) U.S. Cl.
CPC .... *H01L 27/1461* (2013.01); *H01L 27/14643* (2013.01); *H01L 27/14689* (2013.01)

(58) Field of Classification Search
CPC .......................................... H01L 27/146–14893
See application file for complete search history.

(56) References Cited

U.S. PATENT DOCUMENTS

| | | | |
|---|---|---|---|
| 7,842,987 B2 | 11/2010 | Mabuchi | |
| 2005/0121708 A1 | 6/2005 | Hong | |
| 2009/0200580 A1* | 8/2009 | Rhodes | H01L 27/1464 257/233 |
| 2012/0138897 A1* | 6/2012 | Lin | H01L 21/02532 257/E21.103 |
| 2013/0082309 A1* | 4/2013 | Su | H01L 27/0617 438/300 |
| 2015/0333092 A1 | 11/2015 | Fujii | |

* cited by examiner

*Primary Examiner* — Andres Munoz
(74) *Attorney, Agent, or Firm* — Christensen O'Connor Johnson Kindness PLLC (57) ABSTRACT

A pixel cell with an elevated floating diffusion region is formed to reduce diffusion leakage (e.g., gate induced drain leakage, junction leakage, etc.). The floating diffusion region can be elevated by separating a doped floating diffusion region from the semiconductor substrate by disposing an intervening layer (e.g., undoped, lightly doped, etc.) on the semiconductor substrate and beneath the doped floating diffusion region. For instance, the elevated floating diffusion region can be formed by stacked material layers composed of a lightly or undoped base or intervening layer and a heavy doped (e.g., As doped) "elevated" layer. In some examples, the stacked material layers can be formed by first and second epitaxial growth layers.

20 Claims, 5 Drawing Sheets

IMAGE SENSOR WITH ELEVATED FLOATING DIFFUSION

BACKGROUND INFORMATION

Field of the Disclosure

This disclosure relates generally to image sensors, and in particular but not exclusively, relates to image sensors that aim to suppress floating diffusion leakage.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

Integrated circuit (IC) technologies for image sensors are constantly being improved, especially with the constant demand for higher resolution and lower power consumption. Such improvements frequently involve scaling down device geometries to achieve lower fabrication costs, higher device integration density, higher speeds, and better performance.

But as the miniaturization of image sensors progresses, defects within the image sensor architecture become more readily apparent and may reduce the image quality of the image. For example, excess current leakage within certain regions of the image sensor may cause high dark current, sensor noise, white pixel defects, and the like. These defects may significantly deteriorate the image quality from the image sensor, which may result in reduced yield and higher production costs.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

Examples of an apparatus with an elevated floating diffusion are described herein for suppressing floating diffusion leakage (gate induced drain leakage (GIDL), junction leakage, etc.) in CMOS image sensors. Examples of a method for fabricating an apparatus with an elevated floating diffusion are also provided. Thus, in the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

Additionally, it will also be understood that when a layer is referred to as being "between" two layers, it can be the only layer between the two layers, or one or more intervening layers may also be present. Similarly, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Example embodiments may be described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As will be shown, examples of a pixel cell of an image sensor are disclosed. One or more of these examples can be arranged in a pixel array and employed, for instance, for high dynamic range imaging In some examples, a shared pixel cell architecture is employed in which two or more photosensitive regions, such as photodiode regions, are coupled to a common floating diffusion through respective transfer transistors, and to common transistors such as common reset transistor and common source follower transistor.

In current shared pixel architectures, the floating diffusion (FD) is formed as a highly (+) doped region of the semiconductor substrate that is positioned between the transfer gates of the first and second photodiode regions. The floating diffusion is surrounded by an inversely doped region of the semiconductor substrate. A highly conductive FD contact is coupled to the floating diffusion for connection to other components of the pixel cell circuit, such as the reset transistor and/or source follower transistor of a 4T pixel cell. A gate insulating layer, sometimes referred to as a gate oxide (GOX) layer can be employed to isolate the floating diffusion (FD) and the transfer gates.

Typically, the floating diffusion is highly (+) doped in order to form an ohmic contact (e.g., to provide lower contact resistance, lower IR drop and/or lower power consumption at the floating diffusion-contact junction). However, the use of a highly (+) doped region for the floating diffusion can degrade pixel performance (e.g., white pixel, fixed patterned noise) due to, for example, very high leakage during integration. For example, an abrupt junction at the gate edge between a higher (+) doping region and a potentially overlapping poly-silicon transistor gate increases gate induced drain leakage (GIDL). Additionally, a highly (+) dosed implant can cause silicon damage at the junction, causing Trap-Assisted-Tunneling (TAT) leakage.

The methodologies and technologies of the present disclosure seek to address these issues associated with a highly-doped, floating diffusion region in a shared pixel cell, or others. For instance, examples of the disclosed subject matter aim to minimize or reduce the leaking current at or near the floating diffusion region of a pixel cell for facilitating increased image quality, increased yield, faster speed, etc. In particular, examples of the disclosed subject matter aim to reduce diffusion leakage (e.g., gate induced drain leakage (GIDL), junction leakage, etc.) associated with the floating diffusion region of a pixel cell with a shared-pixel design.

As will be described in more detail below, the transistors of the pixel cell in example embodiments may be of the N-metal-oxide-semiconductor (NMOS) type, in which the metal may be polycrystalline silicon (poly-Si), tungsten (W) and the like, the oxide may be a dielectric such as $SiO_2$ (e.g., thermally grown or deposited on the semiconductor material), and the semiconductor may correspond to a portion of the semiconductor material, such as silicon (e.g., single crystal or polycrystalline Si), silicon on insulator (SOI), etc.

In the various examples described herein, an elevated floating diffusion region is formed to reduce diffusion leakage (e.g., gate induced drain leakage, junction leakage, etc.) of a pixel cell, such as a shared pixel cell. In some examples, the floating diffusion region is elevated by separating a doped floating diffusion region from the semiconductor substrate by disposing an intervening layer (e.g., undoped, lightly doped, etc.) on the semiconductor substrate and beneath the doped floating diffusion region.

For instance, the elevated floating diffusion region can be formed in some examples by stacked material layers composed of a lightly or undoped base or intervening layer and a heavy doped "elevated" layer. The elevated layer has a first conductive type, such as N-type doped (e.g., As doped) that is opposite to the conductive type (a second conductive type) of the semiconductor substrate (e.g., P-type doped semiconductor substrate). In some examples, the stacked material layers can be formed by first and second epitaxial growth layers.

The formation and arrangement of the un-doped or lightly doped intervening layer leads to reducing or eliminating GIDL by suppressing doping diffusion under the gate edge, as an abrupt junction under the gate edge is avoided. The un-doped or lightly doped intervening layer also reduces the possibility of silicon damage that is typically caused by high (+) doping, thereby reducing the possibility of TAT leakage. The heavy doped "elevated layer" of this configured suitably provides an ohmic contact at the floating diffusion.

Figure 1:
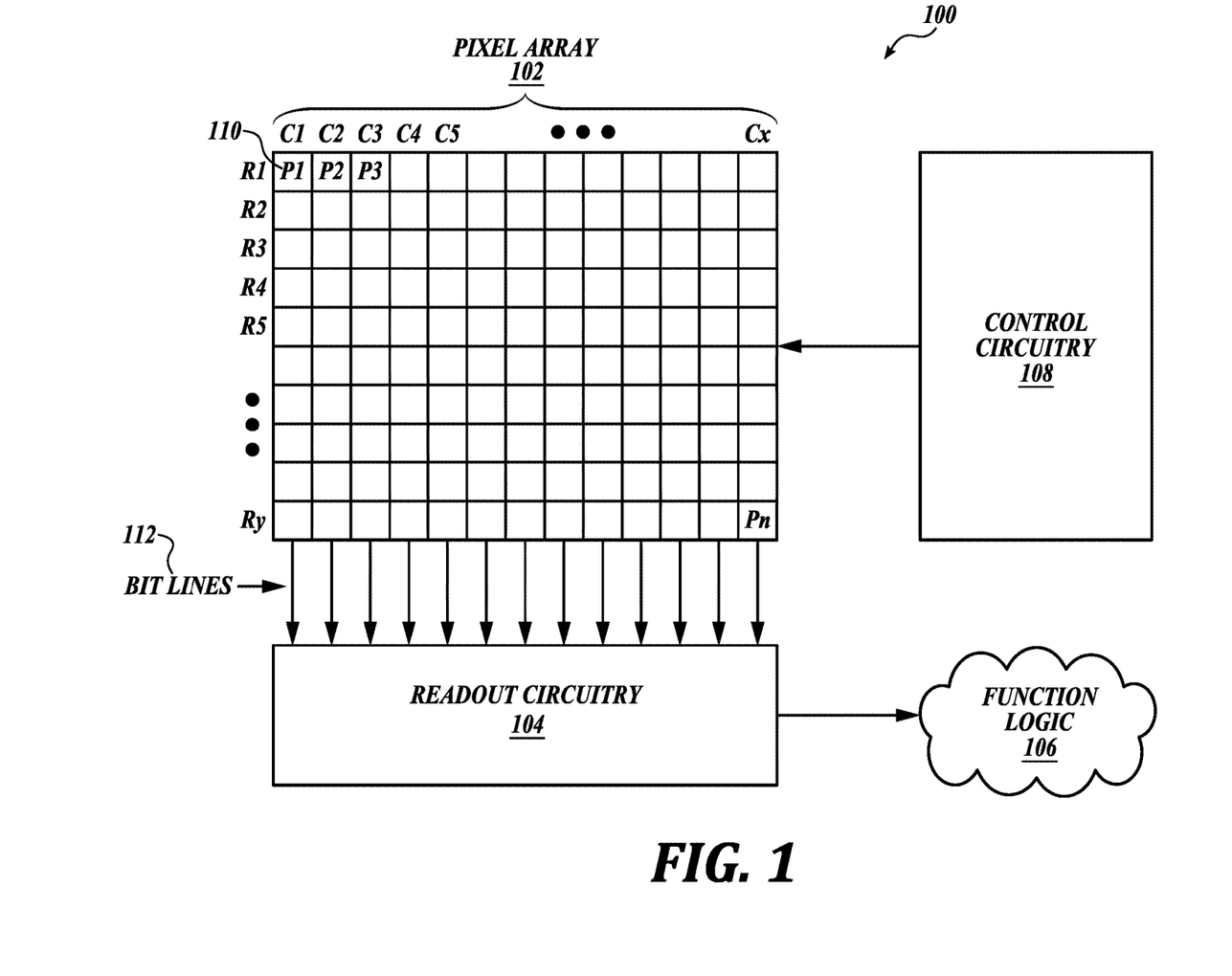
FIG. 1 illustrates one example of an image sensor according to an embodiment of the present disclosure.

To illustrate, FIG. 1 illustrates a block diagram illustrating an example image sensor 100 in accordance with technologies and methodologies of the present disclosure. Image sensor 100 may be implemented as complementary metal-oxide-semiconductor ("CMOS") image sensor. As shown in the example illustrated in FIG. 1, image sensor 100 includes pixel array 102 coupled to control circuitry 108 and readout circuitry 104, which is coupled to function logic 106.

The illustrated embodiment of pixel array 102 is a two-dimensional ("2D") array of imaging sensors or pixel cells 110 (e.g., pixel cells P1, P2, . . . , Pn). In one example, each pixel cell includes one or more subpixels or pixel regions that can be used for imaging in accordance with technologies and methodologies of the present disclosure. As illustrated, each pixel cell 110 is arranged into a row (e.g., rows R1 to Ry) and a column (e.g., columns C1 to Cx) to acquire image data of a person, place or object, etc., which can then be used to render an image of the person, place or object, etc. As will be described in greater detail below, each pixel cell 110 (e.g., pixel cells P1, P2, . . . , Pn) may include, for example, a shared, elevated floating diffusion in accordance with technologies and methodologies of the present disclosure.

In one example, after each pixel cell 110 has acquired its image data or image charge, the image data is read out by readout circuitry 104 through readout column bitlines 112 and then transferred to function logic 106. In various examples, readout circuitry 104 may include amplification circuitry (not illustrated), a column readout circuit that includes analog-to-digital conversion (ADC) circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For instance, in one example control circuitry 108 generates the transfer gate signals and other control signals to control the transfer and readout of image data from the subpixels or pixel regions of the shared pixel cell 110 of pixel array 102. In addition, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

In one example, the control circuitry 108 may control the timing of various control signals provided to the pixel cell 110 to reduce the dark current associated with floating diffusions of each of the pixel cells 110. The pixel cells 110, in some non-limiting embodiments, are of a shared pixel architecture in which two or more photosensitive regions, such as photodiode regions, are coupled to a common floating diffusion via first and second transfer gates, and include three or more pixel transistors, such as a reset transistor, a source follower, a row select transistor, and dual floating diffusion transistor.

In one example, image sensor 100 may be included in a digital camera, cell phone, laptop computer, or the like. Additionally, image sensor 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to image sensor 100, extract image data from image sensor 100, or manipulate image data supplied by image sensor 100.

Figure 2:
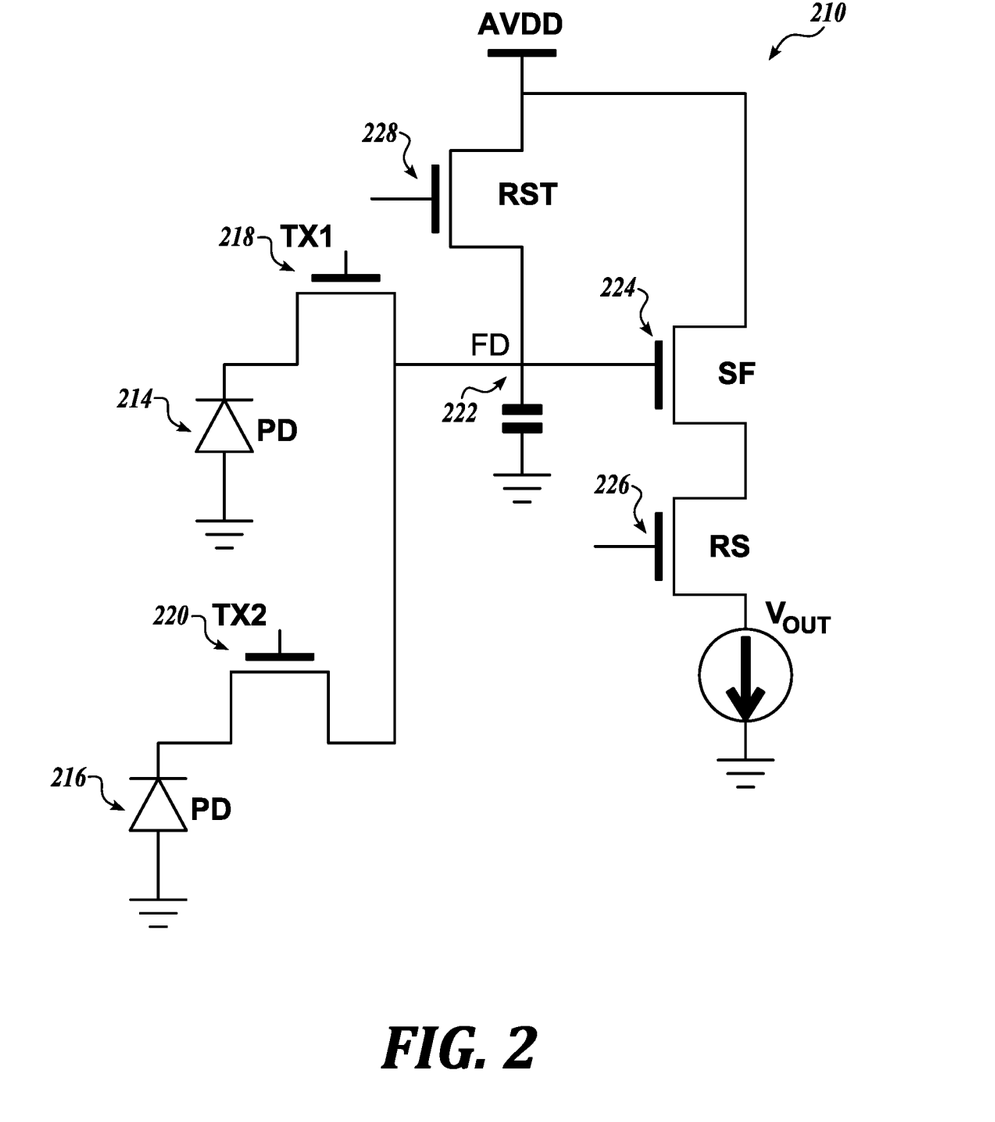
FIG. 2 is an illustrative schematic of one example of a pixel cell in accordance with an embodiment of the present disclosure.

FIG. 2 is an illustrative schematic of an example pixel cell 210 in accordance with the teachings of the present disclosure. However, it should be appreciated that embodiments of the present disclosure are not limited to the pixel architecture of FIG. 2; rather, one of ordinary skill in the art having the benefit of the instant disclosure will understand that the present teachings are also applicable to shared pixel designs, for example, 5T designs for a two-shared pixel cell, 7T designs for a four-shared pixel cell, 9T designs for a six-shared pixel cell, and various other pixel architectures.

It is appreciated that pixel cell 210 of FIG. 2 may be an example of a pixel cell 110 of FIG. 1, and that similarly named and numbered elements referenced below may be coupled and function similar to as described above. For example, the pixel cell 210 may be coupled to a bitline, e.g., readout column, which may provide image data to readout circuitry, such as the readout circuitry 104, and the pixel cell 210 may receive control signals from control circuitry, such as control circuitry 108, to control the operation of the various transistors of the pixel cell 210. The control circuitry may control the operation of the transistors in desired sequences with relative timing in order to reset the pixel to a dark state, for example, and to read out image data after an integration, for example.

The illustrated example of the pixel cell 210 includes a first photosensitive or photoelectric conversion element, such as first photodiode 214, and a second photosensitive or photoelectric conversion element, such as second photodiode 216. In operation, the first and second photodiodes 214, 216 are coupled to photogenerate image charge in response to incident light. In an embodiment, the first and second photodiodes 214 and 216 can be used to provide image data for a high dynamic range (HDR) image, for example having different integration time or light sensitivity.

Pixel cell 210 also includes a first transfer gate 218, a second transfer gate 220, and a floating diffusion 222 disposed between the first and second transfer gates 218, 220. First transfer gate 218 is coupled to transfer image charge from first photodiode 214 to the floating diffusion 222 in response to a first transfer gate signal TX1. Second transfer gate 220 is coupled to transfer image charge from second photodiode 214 to the floating diffusion 222 in response to a second transfer gate signal TX2. In the depicted arrangement, the floating diffusion 222 is common to both the first and second photodiodes 214, 216, and can be referred to as a common or shared floating diffusion 222.

A reset transistor 228 is coupled to the common floating diffusion 222 to reset the pixel cell 210 (e.g., discharge or charge the first and second photodiodes 214, 216, and the floating diffusion 222 to a preset voltage) in response to a reset signal RST. The gate terminal of an amplifier transistor 224 is also coupled to the floating diffusion 222 to generate an image data signal in response to the image charge in the floating diffusion 222. In the illustrated example, the amplifier transistor 224 is coupled as a source-follower (SF) coupled transistor. A row select transistor 226 is coupled to the amplifier transistor SF 224 to output the image data signal to an output bitline 212, which is coupled to readout circuitry such as readout circuitry 104 of FIG. 1, in response to a row select signal RS.

Control signals TX1 and TX2 enable the transfer gates 218, 220 to transfer the charges from the photodiodes 214, 216 to the floating diffusion 222. The amount of charge transferred from the photodiodes to the floating diffusion may depend on a current operation of the pixel cell 210. For example, during a reset operation, the charge may be charge generated in a dark state of the photodiode(s), but during an integration, the charge may be photogenerated image charge. At the end of an integration, the image charge may be readout twice with one or more dark readings occurring between the two to perform correlated double sampling (CDS).

Figure 3:
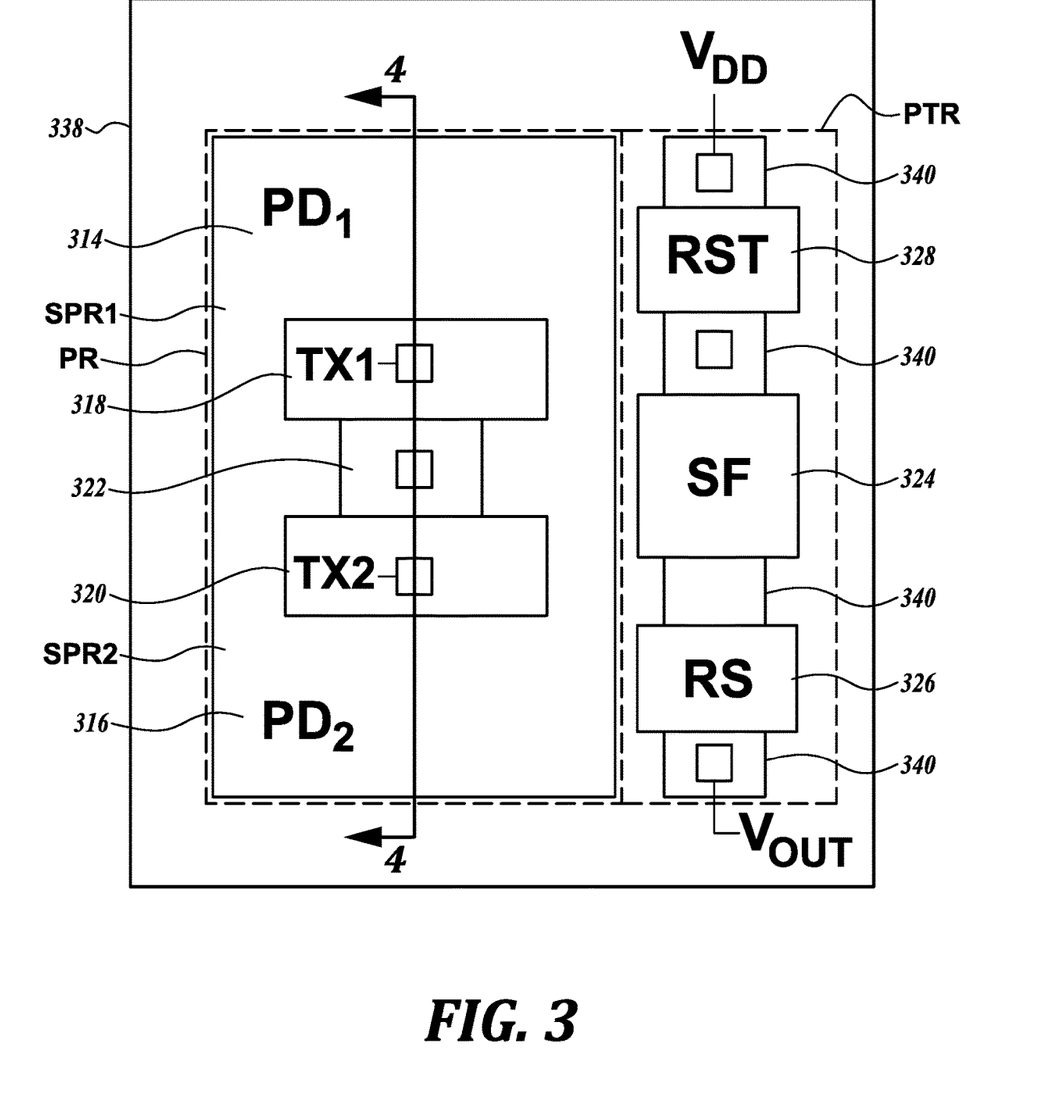
FIG. 3 is a top schematic partial view of one example of a pixel cell in accordance with an embodiment of the present disclosure.

FIG. 3 is a layout schematic view, or top schematic view, of an example pixel cell 310 in accordance with technologies and methodologies of the present disclosure. It is appreciated that the pixel cell 310 of FIG. 3 may be an example of pixel cell 210 of FIG. 2, or an example of pixel cell 110 of FIG. 1, and that similarly named and numbered elements referenced below may be coupled and function similar to as described above. In an example embodiment, a plurality of pixel cells 310 can be arranged in rows and columns to form a pixel array suitable for use in an image sensor, for example.

As shown in the example depicted in FIG. 3, pixel cell 310 includes a pixel region PR, composed of one or more subpixel regions, and a pixel transistor region PTR. Embodiments of the pixel cell 310 that include more than one subpixel region "share" the pixel transistor region PTR, and thus, can be referred to as a shared pixel cell. While the embodiment shown includes two subpixel regions, SPR1, SPR2 for two-shared pixel cell, the pixel cell 310 can include more (or less) subpixel regions in other embodiments. For example in a four-shared pixel cell, the pixel cell 310 can include four subpixel regions shared a common floating diffusion region and pixel transistor region PTR.

As shown in the example depicted in FIG. 3, the pixel region PR of the pixel cell 310 includes first and second subpixel regions SPR1, SPR2, also referred to as subpixels. The first and second subpixel regions SPR1, SPR2 include respective first and second photosensitive elements, such as photodiodes (PD) 314, 316. The first and second photodiodes 314, 316 are formed or otherwise disposed in a semiconductor material 338. The semiconductor material 338 may comprise, for example, any suitable type of semiconductor body or substrate (e.g., silicon/CMOS bulk, SiGe, SOI, etc.) such as a semiconductor wafer, one or more die on a wafer, or any other type of semiconductor and/or epitaxial layers formed thereon and/or otherwise associated therewith.

In operation, the first and second photodiodes 314, 316 are adapted to photogenerate image charge in response to incident light. In one example embodiment, the first and second photodiodes 314, 316 are N-type pinned photodiodes (NPPDs). As illustrated in the depicted example, the first and second photodiodes 314, 316 can be coupled to a common floating diffusion (FD) 322 via first and second transfer gates 318, 320, respectively. For example, the first transfer gate 318 is coupled to transfer the image charge from the first photodiode 314 to the common floating diffusion 322 in response to a first transfer gate signal TX1. The second transfer gate 320 is coupled to transfer the image charge from the second photodiode 316 to the floating diffusion 322 in response to a second transfer gate signal TX2.

As will be described in more detail below, the floating diffusion 322 in some example embodiments is formed by stacked layers that elevate a floating diffusion region above the semiconductor material 338. In some examples, the floating diffusion 322 is formed by first and second epitaxial layers formed sequentially on the semiconductor substrate 338. Also as will be described in more detail below, the pixel cell 310 may include first and second buried channel regions, which are associated with the first and second transfer gates 318, 320 to form buried channel devices.

Still referring to the example depicted in FIG. 3, the pixel transistor region PTR of pixel cell 310 is positioned adjacent the first and second subpixel regions SPR1 and SPR2. In some embodiments, there is a shallow trench isolation structure disposed between the pixel region PR and the pixel transistor region PTR providing electrical isolation between photodiodes and pixel transistors in the pixel transistor region PTR. In some embodiments, there is a doped isolation well structure, for example a P-type well region formed of P-type dopant such as boron, disposed between the pixel region PR and the pixel transistor region PTR providing electrical isolation between photodiodes and pixel transistors.

Within the pixel transistor region PTR, the pixel cell 310 includes a gate and doped regions (i.e., drain and source) for a reset transistor (RST), an amplifier transistor acting as a source-follower (SF), and a row select transistor (RS). For example, as shown in the embodiment depicted in FIG. 3, a plurality of transistor gates, including amplifier transistor (SF) gate 324, and row select (RS) gate 326, reset transistor (RST) gate 328, 30, as well as source/drains 340 are formed or otherwise disposed in/on the semiconductor material 338.

As shown in the example depicted in FIG. 3, contacts are provided on each transfer gate 318, 320 of the pixel region PR for transmission of TX1, TX2 signals. Contacts (not shown) are also formed on each gate of the pixel transistor region PTR for transmission of RST and RS signals. Contacts are also provided on various source/drains 340 for coupling to a voltage, such as voltage VDD, or to output a signal, such as voltage Vout. Other contacts may be provided on one or more source/drains 340 for coupling to, for example, the FD contact of the floating diffusion 322, which may be used to connect floating diffusion 322 to the amplifier transistor (SF) gate 324.

As will be described in more detail below, a variety of materials and fabrication techniques may be utilized to form the pixel cell 310. The semiconductor substrate or material 338 may have a composition of Si (e.g., single crystal or polycrystalline Si). The gates may have a composition including tungsten or polycrystalline silicon. Dielectric layers (not shown) may have a composition of $SiO_2$, $HfO_2$, or any other suitable dielectric medium known by one of ordinary skill in the art. Contacts may be constructed of any doped material with low ohmic resistance. Other metals, semiconductors, and insulating materials may also be utilized for pixel cell 310, as known by one of ordinary skill in the art. Doped regions of the semiconductor material may be formed by diffusion, implantation, and the like. It will be appreciated that the doping polarities or doping types (P-type, N-type, etc.) in the illustrative embodiments may be reversed in alternative embodiments. Fabrication techniques such as photolithography, masking, chemical etching, ion implantation, thermal evaporation, chemical vapor deposition, sputtering, and the like, as known by one of ordinary skill in the art, may be utilized to fabricate the pixel cell 310, the pixel array 202, and/or the image sensor 100.

Figure 4:
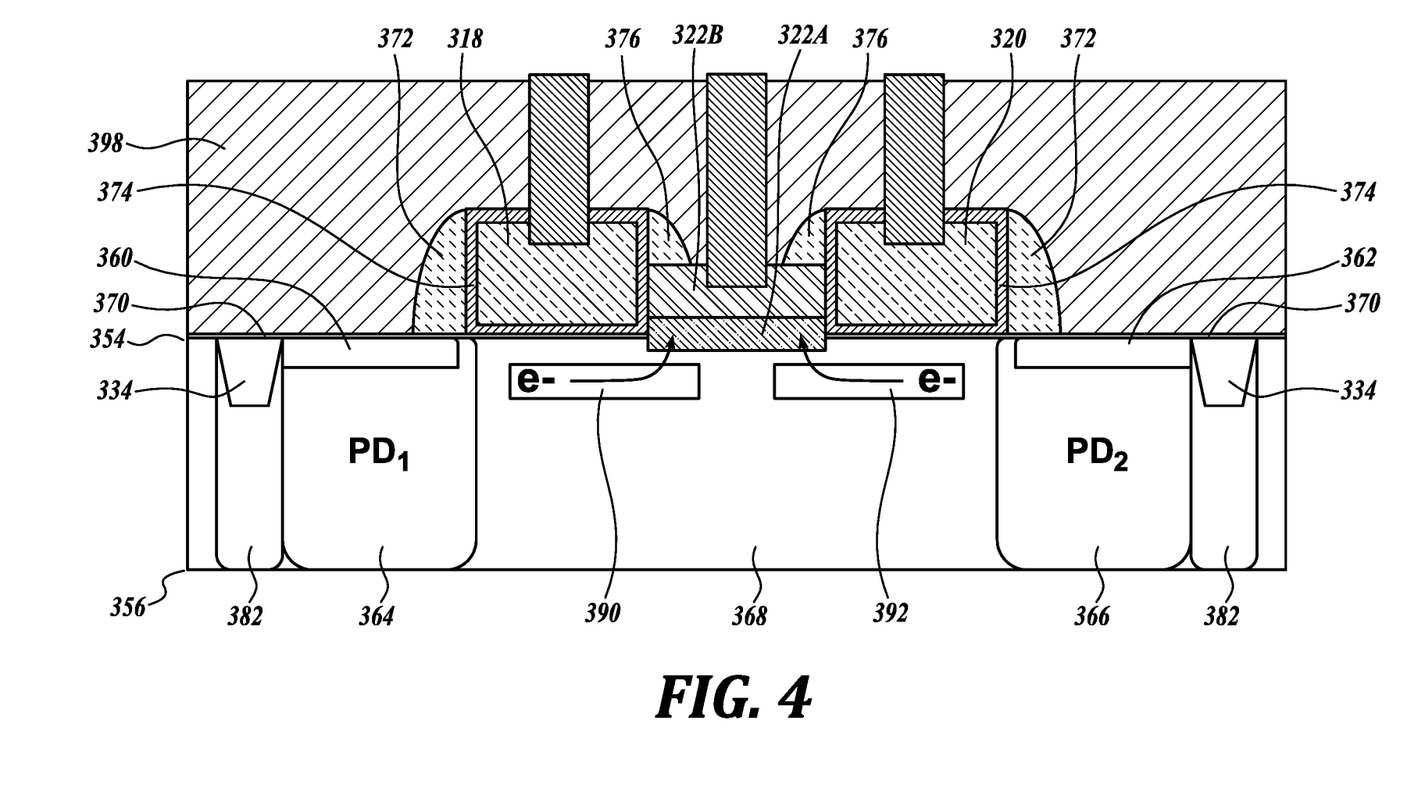
FIG. 4 is schematic cross sectional views of the pixel cell of FIG. 3, taken along lines 4-4.

FIG. 4 is a cross-section view of a portion of a pixel region of a pixel cell, such as pixel cell 310 taken along lines 4-4 of FIG. 3. As shown in the example depicted in FIG. 4, the pixel region is formed or otherwise disposed in a semiconductor material 338 having a first surface 354 (e.g., front side surface 354) and a second surface 356 (e.g., back side surface 356). In an example embodiment, the semiconductor material 338 is approximately 2.5-3.5 μm thick, although other semiconductor material thicknesses may be employed. In an example embodiment, the semiconductor material 338 can be a bulk silicon substrate having a first conductive type such as a P-type bulk silicon substrate.

As shown in the example embodiment, pixel cell 310 includes a first transfer gate 318, a second transfer gate 320 spaced apart from the first transfer gate 318, and a floating diffusion 322 of a second conductive type opposite to the first conductive type, disposed in-between the first and second transfer gates 318, 320. Each of the transfer gates 318, 320 and the floating diffusion 322 are formed or otherwise disposed proximate the first surface 354 of semiconductor material 338. As will be described in more detail below, the floating diffusion 322 is comprised of stacked material layers 322A, 322B that form an elevated floating diffusion region.

The pixel cell 310 also includes (P) pinning layers 360, 362, first and second photosensitive elements 364, 366 (e.g. photodiodes PD1, PD2), a doped well region 368, and first and second buried channel dopant regions 390, 392, all disposed or otherwise formed in the semiconductor material 338. Pinning layers 360, 362 are disposed between first surface 354 of semiconductor material 338 and photosensitive elements 364, 366 (e.g. photodiodes PD1, PD2) and adjacent the first and second transfer gates 318, 320, respectively. In an embodiment, the doped well region 368 of the first conductive type, such as a P-type doped well region can be formed, for example, from a section of the P-type bulk silicon substrate.

In the embodiments, a first transfer device is formed between the first transfer gate 318, the first buried channel dopant region 390, and a gate insulating layer 374. A voltage TX1 may be applied to first transistor gate 318 for activating the first transfer device. In the illustrated embodiment, the first transistor gate 318 is disposed above the first buried channel dopant region 390 for forming a first buried channel device. In particular, the first buried channel dopant region 390 may be generally aligned under the first transistor gate 318 and extend under a portion of the common floating diffusion 322. The first buried channel device is coupled between the first photosensitive element 364 (e.g., PD1) and the floating diffusion 322 to facilitate charge transfer from the first photosensitive element 364 to the floating diffusion 322.

Similarly, in embodiments, a second transfer device may be formed between the second transfer gate 320, the second buried channel dopant region 392, and a gate insulating layer 374. A voltage TX2 may be applied to the second transfer gate 320 for activating the second transfer device. In the illustrated embodiment, the second transfer gate 320 is disposed above the second buried channel dopant region 392 for forming a second buried channel device. In particular, the second buried channel dopant region 392 may be generally aligned under the second transfer gate 320 and extend under a portion of the common floating diffusion 322. The second buried channel device is coupled between the second photosensitive element 366 (e.g., PD2) and floating diffusion 322 to facilitate charge transfer from the first photosensitive element 366 to the floating diffusion 322.

When voltages TX1, TX2 are applied, and the first and second transfer devices are turned on, first and second buried channels are created that allow charge carriers (e-) to flow between the photosensitive elements (PD1, PD2) 364, 366 and the stack layers 322A, 322B of the floating diffusion 322 to be described in more detail below. As such, the first transfer gate 318 is coupled to transfer the image charge from the first photodiode 314 to the floating diffusion 322 through the first buried channel, and the second transfer gate 320 is coupled to transfer the image charge from the second photodiode 316 to the floating diffusion 322 through the second buried channel. In an example embodiment, the buried channel dopant regions 390, 392 are of the N-type, and can be implanted, for example, with phosphorus (P) with a dosage level of approximately $1E13/cm^2$.

In the embodiment depicted in FIG. 4, trench isolation (TI) structure 334 is disposed within trenches formed in the first surface 354 of the semiconductor material 338. The trench isolation structure 334 can be positioned between photodiodes of adjacent pixel cells and between pixel transistors in pixel transistor region PTR of FIG. 3, and extend into doped (e.g., P-type) well regions 382 depthwise towards the back side 356 of the semiconductor material 338. The trench isolation structure 334 can be used to electrically and optically isolate the photodiodes, by reflecting light back into the photodiode, and preventing charge from traveling through, and on the surfaces of, semiconductor material 338 into other photodiodes, for example.

In an example embodiment, the trench isolation structure 334 includes a dielectric fill material (e.g., silicon oxide) that is deposited into the trenches formed in the first surface 354 of the semiconductor material 338. In some embodiments, trench isolation structure 334 is a shallow trench isolation structure. In some embodiments, trench isolation structure 334 may extend deeper toward second surface 356 to form a deep trench isolation structure, such as a front-side deep trench isolation structure. In some embodiments, a dielectric layer (not shown) lining the sides and bottom of the trenches may be provided. For example, a high-k liner oxide or the like (e.g., hafnium oxide, silicon oxide, etc.) can create an interface between the deposited dielectric fill material (e.g., silicon oxide) and the doped well regions 382, the pinning layers 360, 362, etc. In some example embodiments, the trench isolation structures 334 may instead include a metal core, which is surrounded by the high-k liner oxide.

A thin oxide (e.g., silicon oxide) layer 370 may be deposited on the first surface 354 of the semiconductor material 338. The thin oxide layer 370 may be formed by using, for example, a CVD and/or ALD process, and/or by thermally oxidizing the semiconductor material 338. In some example embodiments, the thin oxide layer 370 formed thus may cure etch damage during the fabrication process, and may function as a buffer layer between the semiconductor material 338 and one or more front side components of pixel cell 310.

In accordance with an aspect of the present disclosure, the pixel cell 310 further includes a floating diffusion 322 comprised of a first or base diffusion layer 322A disposed below a second or elevated diffusion layer 322B. The first diffusion layer 322A of the floating diffusion 322 is disposed on, and disposed directly on in some embodiments, the doped well region 368. The first diffusion layer 322A is positioned in-between transfer gates 318, 320.

The first diffusion layer 322A may be formed to extend above first surface 354. In the illustrated example, the first diffusion layer 322A has a first portion disposed in the semiconductor material 338 and a second part disposed above first surface 354 of semiconductor material 338. In an example embodiment, the first diffusion layer 322A is disposed in a recess formed in the first surface 354 of the semiconductor material 338 between the first and second transfer gates 318, 320. For example, in an embodiment, a recess can be formed by removal of the thin oxide layer 370 that covers the first surface 354 of the semiconductor material 338 and a portion of semiconductor material 338. In other embodiments, the recess can be formed by removal of a thicker, gate insulating (e.g., gate oxide (GOX)) layer 374 that may cover the first surface 354 of the semiconductor material 338 in-between the first and second transfer gates and a portion of semiconductor material 338. In these embodiments, the first diffusion layer 322A is disposed directly on the doped well region 368 of semiconductor material 338 at the location of the recess without further material removal. In other embodiments, a deeper recess can be formed into the semiconductor material 338 via etching or the like.

In an example embodiment, the first diffusion layer 322A is formed as a first epitaxial growth layer. In some embodiments, the formation of the first epitaxial growth layer takes place under temperatures that range, for example, between about 700 and about 750 degrees Celsius. In some embodiments, the thickness of the first epitaxial growth layer is between about 0.02 µm to about 0.03 µm. In some embodiments, the first epitaxial growth layer is lightly (e.g., N-type) doped during formation with a dosage level of approximately $1E13/cm^2$. In other embodiments, the first epitaxial growth layer can be left undoped to aid in the reduction or avoidance of gate induced drain leakage (GIDL) by suppressing any high dose inclusion under the first and second transfer gates. Moreover, the absence of heavy (+) doping of the first diffusion layer 322A reduces silicon damage, thereby reducing or eliminating TAT leakage.

In an example embodiment, the second diffusion layer 322B is formed as a second epitaxial growth layer doped with dopants of the second conductive type over the first epitaxial growth layer, and is formed directly over the first epitaxial growth layer in some example embodiments. In some embodiments, the formation of the second epitaxial growth layer also takes place under temperatures that range, for example, between about 700 and about 750 degrees Celsius. The second diffusion layer 322B is formed in-between transfer gates 318, 320. The second diffusion layer 322B is in contact with the gate insulating layer 374 covering transfer gates 318, 320.

Alternatively, the second diffusion layer 322B forms a first capacitance with transfer gate 318, and a second capacitance with transfer gate 320. The first and second diffusion layer 322A, 322B form a third capacitance (e.g., junction capacitance) with the semiconductor substrate 368. The first, second and third capacitances collectively forms the effective capacitance of the floating diffusion region. As such, in some embodiments, the thickness of the second epitaxial growth layer is between about 0.035 µm to about 0.040 µm, and can be configured to control the capacitance of the floating diffusion 322.

For example, increasing the thickness of the floating diffusion region, i.e., increase overlapped region between transfer gates (e.g., the first and the second transfer gates 318, 320) and floating diffusion region (e.g., the first and second diffusion layers 322A, 322B), would increase the effective capacitance of the floating diffusion region, providing a smaller conversion gain to the associated pixel cell. For example, for a low conversion gain (LCG) application (e.g., for capturing bright light scene), the thickness of the second diffusion layer 322B can be tuned to have maximum overlapping region between transfer gates (i.e., the thickness of the second diffusion layer can be adjusted to the same height as the transfer gates 318, 320.) Decreasing the thickness of the floating diffusion region, i.e., decrease overlapped region between transfer gates and floating diffusion region, would reduce effective capacitance, yielding larger conversion gain to the associated pixel cell. As such, the thickness (or elevated height above first surface 354) of the second diffusion layer 322B can be configured to modulate the conversion gain of the pixel cell.

In order to provide an ohmic contact, the thickness of the second epitaxial growth layer is greater than the contact etching for the FD contact so that the FD contact does not pass through the second epitaxial growth layer and contact the first epitaxial growth layer. In some embodiments, the second epitaxial growth layer is doped (e.g., N+ type) during formation with, e.g., arsenic (As), at a dosage level of approximately $1E15/cm^2$. Of course, other dosage levels may be practiced with embodiments of the present application as long as the dosage level of the second epitaxial growth layer is higher than the first epitaxial growth layer.

In the example depicted in FIG. 3, the pixel cell 310 further includes first and second gate sidewall spacers 372, 376 positioned adjacent the inner and outer sidewall surfaces, respectively, of the transfer gates 318, 320. In some example embodiments, the second gate sidewall spacers 376 are formed in direct contact with the top surface of the second diffusion layer 322B. The first and second gate sidewall spacers 372, 376 may be bulk silicon nitride spacers or may be constructed out of film layers of silicon oxide, silicon nitride, etc. and/or combinations thereof. The gate sidewall spacers 372, 376 may be deposited by using any suitable process, for example, a thermal CVD, a plasma enhanced CVD, a remote plasma CVD, a microwave plasma CVD and/or an atomic layer deposition (ALD).

In some example embodiments, the first and second gate sidewall spacers 372, 376 are in direct contact with the sidewall surfaces of the transfer gates 318, 320. In other embodiments, an intermediate layer may be provided such as gate oxide layer 374. In the example illustrated, the gate oxide layer 374 encapsulates the first and second transfer gates 318, 320, and has a thickness greater than the oxide layer 370. In some example embodiments, the gate oxide layer 374 is about twice as thick as the oxide layer 370. Other embodiments are contemplated wherein the gate sidewall spacers 372, 376 include other different layers or materials in addition to or in place of the bulk nitride spacers and/or the gate oxide layer. It will be appreciated that an interlayer dielectric (ILD) 398 may be formed over the front side components of the pixel cell 310.

In the illustrated embodiment, photosensitive elements (e.g., PD1, PD2) 364, 366 and second diffusion layer 322B of floating diffusion 322 are N-type doped, while the doped well region 368 is doped inversely (P-type) from the N-type dopant of photosensitive elements (e.g., PD1, PD2) 364, 366 and second diffusion layer 322B. In this embodiment, buried channel dopant regions 390, 392 are also doped N-type. Of course, the doping types (e.g., P-type, N-type) in the illustrated embodiments may be reversed in alternative embodiments.

In operation, during charge transfer operation of the image sensor, the transfer gate 318 operatively forms a first conduction channel coupled to the buried channel dopant region 390 and transfer the photogenerated charges from photodiode PD1 364 to the floating diffusion through the first conduction channel and buried channel dopant region 390 upon receipt of a respective first transfer signal, e.g., first transfer gate signal TX1. Similarly, the transfer gate 320 operatively forms a second conduction channel coupled to the buried channel dopant region 392 and transfer the photogenerated charges from photodiode PD2 366 to the floating diffusion through the second conduction channel and buried channel dopant region 392 upon receipt of a respective second transfer signal, e.g., second transfer gate signal TX2. The floating diffusion region stores the photogenerated charges in at least one of first and second diffusion layer 322A, 322B for subsequent readout, by source follower transistor, for example.

As was described briefly above, methods are contemplating for suppressing floating diffusion leakage in CMOS image sensors. In that regard, methods for reducing diffusion leakage in a pixel cell, such as pixel cell 310, are provided. In an example embodiment, the pixel cell is formed in a semiconductor substrate. The pixel cell includes a pixel region having first and second photosensitive elements (e.g., photodiodes), a doped well region disposed between the first and second photosensitive elements and having a first conductive type, and first and second transfer gates proximate the semiconductor substrate and positioned over the doped well region. The pixel cell also has a pixel transistor region disposed adjacent the pixel region.

A method, in an embodiment, comprises separating (e.g., physically) a doped floating diffusion region from the doped well region of the semiconductor substrate by disposing an intervening layer on the doped well region and beneath the doped floating diffusion region. In an example embodiment, the doped floating diffusion region has a second conductive type that is inversely of the first conductive type and is connected to one or more transistors of the pixel transistor region.

In an example embodiment, the intervening layer can be disposed directly on the doped well region, directly beneath the doped floating diffusion region, and between the first and second transfer gates. In an example embodiment, the intervening layer is undoped or doped (e.g., second conductive type) at a dosage level lower than the doped floating diffusion region.

In an example embodiment, the method further includes forming a recess in the doped well region prior to disposing the intervening layer. The intervening layer can be disposed at least in part in the recess. In an example embodiment, the method further includes forming first and second sidewall spacers disposed on the doped floating diffusion region and adjacent the first and second transfer gates. In other example embodiments, third and fourth sidewall spacers can be disposed adjacent the first and second transfer gates opposite the respective first and second sidewall spacers.

In an example embodiment, the method further includes forming first and second buried channel dopant regions in the doped well region through ion implantations. The first and second buried channel dopant regions have a conductive type inversely of the doped well region. In an example embodiment, the first and second transfer gates couple to the first and second photosensitive elements, respectively, via the first and second buried channel dopant regions to transfer first and second image charge accumulated in the first and second photosensitive elements into the doped floating diffusion region in response to first and second transfer signals applied to the first and second transfer gates, respectively.

In an example embodiment, the method further includes controlling the thickness of the floating diffusion region, for example, the thickness of the second layer 322B in order to control and/or modulate an effective capacitance of the floating diffusion region. This permits modulation of the conversion gain (CG) of the floating diffusion region.

Figure 5:
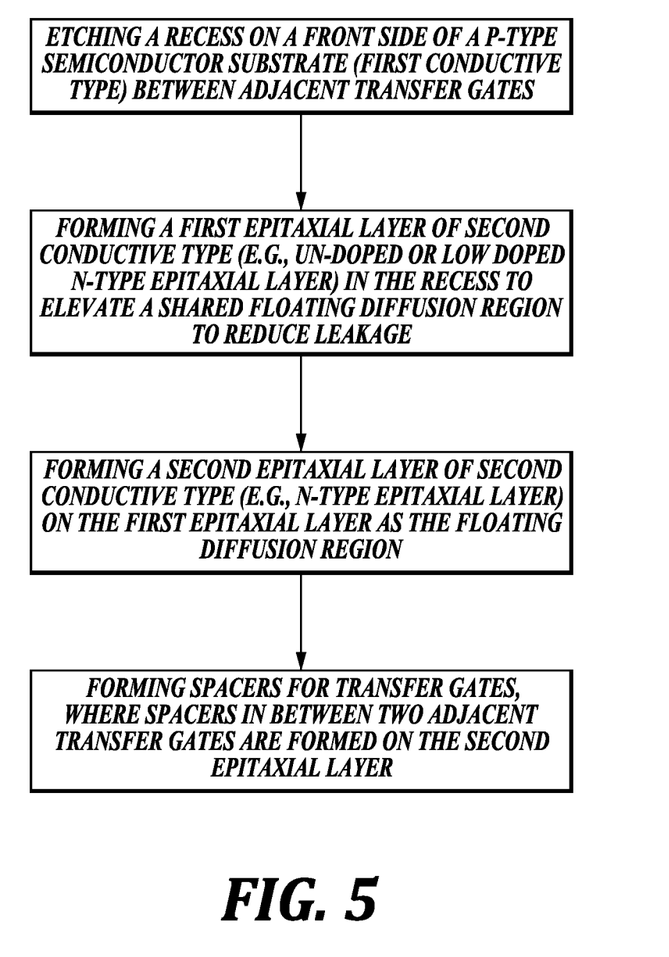
FIG. 5 is an example flow chart for fabricating the pixel cell of FIG. 3 in accordance with an embodiment of the present disclosure.

FIG. 5 is a flow chart illustrating one example of a method for fabricating a pixel cell, such as pixel cell 310, in accordance with the teachings of the present disclosure. It will be appreciated that the following method steps can be carried out in any order or at the same time, unless an order is set forth in an express manner or understood in view of the context of the various operation(s). Additional process steps can also be carried out, including chemical-mechanical polishing, masking, additional doping, etc. Of course, some of the method steps can be combined or omitted in example embodiments. In some example, the actions of FIG. 5 may be carried after the formation of photodiode regions and gate electrodes of pixel transistors.

In an example embodiment, the pixel cell 310 is formed in a semiconductor substrate 338 and has a pixel region PR having one or more photosensitive elements 318, 320 and a pixel transistor region PTR disposed adjacent the pixel region PR. A method, in an embodiment, comprises providing a recess on a front side of a semiconductor substrate of the first conductive type between first and second transfer gates. In an example method, the recess can be formed in the first surface 354 of the semiconductor material 338 (e.g., front side of the doped well region 368) between the first and second transfer gates 318, 320 by removal of the thin oxide layer 370 that can cover the entire first surface 354 of the semiconductor material 338. In other embodiments, the recess can be formed by removal of the thicker, gate oxide layer 374 that may cover the first surface 354 of the semiconductor material 338 in-between the first and second transfer gates 318, 320. In other embodiments, a deeper recess can be formed into the semiconductor material 338 via etching or the like.

For example, after formation of the transfer gates 318, 320 via polysilicon (e.g., n-type or p-type doped polysilicon material) deposition, poly hard masking (HM), etching, and annealing process, the first surface 354 of semiconductor material 338 as well as the surfaces of the transfer gates are subjected to a re-oxidation process to form gate insulating layer 374 on the top and sidewalls of the first and second transfer gates 318, 320. Once re-oxidation has occurred, a photoresist can be deposited onto the top surfaces of the transfer gates 318, 320 and portions of the first surface 354 of the semiconductor material 338 such that the floating diffusion (FD) area (the area between the first and second transfer gates 318, 320) is left open. Next, the oxide layer, such as the gate oxide layer 374 and/or the thin oxide layer 370, can be removed from between the first and second transfer gates 318, 320, thereby forming a thin (e.g., shallow) recess. In some example embodiments, re-oxidation is carried out in a suitable manner in order to form the gate insulating layer 374 over the transfer gates surfaces and between the transfer gates with substantially the same thickness.

The method also includes the step of forming a first or base diffusion layer of a second conductive type, such as first diffusion layer 322A, in the newly formed recess. For example, after an optional surface treatment to clean the surface of the recess, a first or base diffusion layer is formed directly on the surface of the recess. The first or base diffusion layer can be disposed at least in part into the recess. In an embodiment, the first or base diffusion layer is a low (N-type) doped material layer. In another example embodiment, the first or diffusion base layer is an un-doped material layer. In either case, forming the first or base layer of a second conductive type in an example embodiment includes forming a first epitaxial growth layer in the recess and in direct contact with the semiconductor material 338.

In an example embodiment, the formation of the first epitaxial growth layer takes place under temperatures that range, for example, between about 700 and about 750 degrees Celsius. In some example embodiments, the first epitaxial growth layer is formed with a thickness of between about 200 Å to about 300 Å. In some embodiments, the first epitaxial growth layer can be left undoped to aid in, for example, the reduction or avoidance of gate induced drain leakage (GIDL) by suppressing any high dose inclusion under the first and second transfer gates. The shallow junction between the first epitaxial growth layer and the doped well region also aids in the reduction or elimination of GIDL. In other example embodiments, the first epitaxial growth layer is lightly (e.g., N-type) doped during formation with a dosage level of approximately 1E13/cm$^2$. As such, the absence of heavy (+) implantation of this first epitaxial growth layer of the floating diffusion 322 reduces or eliminates silicon damage, thereby reducing or eliminating TAT-type junction leakage.

The method further includes forming a second "elevated" diffusion layer of a second conductive type, such as second diffusion layer 322B, on the first or base diffusion layer in order to form an elevated floating diffusion region. As such, the first or base diffusion layer acts as an intervening layer to separate and elevate the second layer from the semiconductor substrate. In some example embodiments, the second "elevated" diffusion layer of a second conductive type is formed directly on the first or base diffusion layer in order to form an elevated floating diffusion region. In an example embodiment, the second layer is a (N+) doped material layer. In an example embodiment, forming the second diffusion layer of the second conductive type includes forming a second epitaxial growth layer directly on the first epitaxial growth layer.

In an example embodiment, the second epitaxial growth layer is arranged to be formed between and in contact with the gate insulating layers 374 of the first and second transfer gates. In some example embodiment, the thickness of the second epitaxial growth layer (e.g., elevational height of the second epitaxial growth layer) can be configured to control or modulate the capacitance of the floating diffusion region, thereby modulating the conversion gain of the floating diffusion region.

In an example embodiment, the formation of the second epitaxial growth layer also takes place under temperatures that range, for example, between about 700 and about 750 degrees Celsius. In some example embodiments, the thickness of the second epitaxial growth layer is between about 350 Å to about 400 Å. In order to provide an ohmic contact, the second epitaxial growth layer is formed with a suitable thickness greater than the FD contact etching for the FD contact so that the FD contact does not pass through the second epitaxial growth layer and contact the first epitaxial growth layer. In some embodiments, the second epitaxial growth layer is doped (e.g., N+ type) during formation with, e.g., arsenic (As), at a dosage level of approximately 1E15/cm$^2$. Of course, other dosage levels may be practiced with embodiments of the present application as long as the dosage level of the second epitaxial growth layer is higher than the first epitaxial growth layer. In some example embodiments, the thickness of the doped second epitaxial growth layer can be controlled to modulate the capacitance of the floating diffusion region. This provides for modulation of the conversion-gain (CG) of the floating diffusion.

In an example embodiments, at least one of the first and second epitaxial growth layers is formed by an in-situ doped epitaxial growth process.

The method can also include other process steps. For example, first and/or second gate sidewall spacers, such as spacers 372, 376, can be formed adjacent the first and second transfer gates 318, 320. In an example embodiment, first gate sidewall spacers 372 can be disposed against the outer facing sidewalls of the first and second transfer gates 318, 320. In another example embodiment, second gate sidewall spacers 376 can be disposed between the first and second transfer gates 318, 320 and directly on the top surface of second epitaxial growth layer. Contacts, other transistor components, and the interlayer dielectric (ILD) 398 can be also formed.

While example embodiments described above relate to a shared pixel cell, other architectures, such as non-shared pixel cells (e.g., one photosensitive region per pixel transistor region), may employ the methodologies and technologies of the present disclosure. Also, the present application may reference quantities and numbers. Unless specifically stated, such quantities and numbers are not to be considered restrictive, but exemplary of the possible quantities or numbers associated with the present application. Further in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed. And as used herein the term "and/or" includes any and all combinations of one or more of the associated listed items.

The above description of illustrated examples of the present disclosure, including what is described in the Abstract, are not intended to be exhaustive or to be a limitation to the precise forms disclosed. While specific embodiments of, and examples for, the present disclosure are described herein for illustrative purposes, various equivalent modifications are possible without departing from the broader spirit and scope of the present disclosure, as claimed. Indeed, it is appreciated that the specific example voltages, currents, frequencies, power range values, times, etc., are provided for explanation purposes and that other values may also be employed in other embodiments and examples in accordance with the teachings of the present disclosure.

These modifications can be made to examples of the disclosed subject matter in light of the above detailed description. The terms used in the following claims should not be construed to limit the claimed subject matter to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
   a semiconductor substrate having a front surface and a doped well region having a first conductivity type;
   a first photodiode disposed in the semiconductor substrate adjacent to the doped well region, the first photodiode adapted to photogenerate image charge in response to incident light;
   a second photodiode disposed in the semiconductor substrate adjacent to the doped well region, the second photodiode adapted to photogenerate image charge in response to incident light;
   a first transfer gate disposed proximate to the front surface of the semiconductor substrate;

a second transfer gate disposed proximate to the front surface of the semiconductor substrate, the second transfer gate positioned a spaced distance from the first transfer gate;

a floating diffusion disposed in between the first transfer gate and the second transfer gate, the floating diffusion comprising a first floating diffusion layer disposed on the front surface of the semiconductor substrate adjacent to the doped well region and a second floating diffusion layer disposed on the first floating diffusion layer, the second floating diffusion layer having a second conductivity type opposite the first conductivity type of the doped well region, wherein both the first floating diffusion layer and the second floating diffusion layer are disposed laterally between the first transfer gate and the second transfer gate, and wherein the first transfer gate and the second transfer gate are coupled to transfer the image charge from the first photodiode and the second photodiode to the second floating diffusion layer; and a sidewall spacer disposed proximate to the first transfer gate or the second transfer gate, and wherein the second floating diffusion layer is disposed between the sidewall spacer and the first floating diffusion layer.

2. The pixel cell of claim 1, wherein the second floating diffusion layer has a thickness, the thickness of the second floating diffusion layer being configurable to modulate a conversion gain of the pixel cell.

3. The pixel cell of claim 1, wherein at least one of the first floating diffusion layer or the second floating diffusion layer is an epitaxial growth layer.

4. The pixel cell of claim 1, wherein the first floating diffusion layer has a portion disposed in the semiconductor substrate and a portion disposed above the front surface of the semiconductor substrate.

5. The pixel cell of claim 1, wherein the first floating diffusion layer is undoped.

6. The pixel cell of claim 1, wherein the first floating diffusion layer is of the second conductivity type, the first floating diffusion layer being doped with a dosage level less than a dosage level of the second floating diffusion layer.

7. The pixel cell of claim 6, wherein the first floating diffusion layer is N-type doped at a dosage level of approximately $1E13/cm^2$ and the second floating diffusion layer is N-type doped at a dosage level of approximately $1E15/cm^2$.

8. The pixel cell of claim 1, further comprising first and second buried channel dopant regions disposed in the doped well region of the semiconductor substrate, wherein the first and the second buried channel dopant regions are respectively positioned beneath the first transfer gate and the second transfer gate, respectively, and beneath a portion of the floating diffusion, the first and the second buried channel dopant regions having the second conductivity type for respectively forming a first channel region and a second channel region to respectively transfer the image charge from the first photodiode and the second photodiode to the floating diffusion.

9. The pixel cell of claim 8, wherein the first and the second buried channel dopant regions are N-type doped at a dosage level of approximately $1E13/cm^2$.

10. The pixel cell of claim 1, further comprising a gate oxide layer in surrounding relationship with the first transfer gate and the second transfer gate.

11. The pixel cell of claim 10, further comprising a first sidewall spacer corresponding to the sidewall spacer and a second sidewall spacer, each formed on the second floating diffusion layer and further positioned against the gate oxide layer, and wherein the second floating diffusion layer is disposed between the first floating diffusion layer and the first and the second sidewall spacers.

12. The pixel cell of claim 11, further comprising a recess formed in the front surface of the semiconductor substrate, the recess disposed between the first transfer gate and the second transfer gate, wherein the first floating diffusion layer is disposed in the recess in direct contact with the semiconductor substrate.

13. The pixel cell of claim 1, wherein a thickness of the first floating diffusion layer is between 0.02 μm to 0.03 μm, and a thickness of the second floating diffusion layer is between 0.035 μm to 0.040 μm.

14. A pixel cell, comprising:
a semiconductor substrate having a front surface and a doped well region having a first conductivity type;
a first photodiode disposed in the semiconductor substrate adjacent to the doped well region, the first photodiode adapted to photogenerate image charge in response to incident light;
a second photodiode disposed in the semiconductor substrate adjacent to the doped well region, the second photodiode adapted to photogenerate image charge in response to incident light;
a first transfer gate disposed proximate to the front surface of the semiconductor substrate;
a second transfer gate disposed proximate to the front surface of the semiconductor substrate, the second transfer gate positioned a spaced distance from the first transfer gate;
a floating diffusion disposed in between the first transfer gate and the second transfer gate, the floating diffusion comprising a first floating diffusion layer disposed on the front surface of the semiconductor substrate adjacent to the doped well region and a second floating diffusion layer disposed on the first floating diffusion layer, the second floating diffusion layer having a second conductivity type opposite the first conductivity type of the doped well region, wherein both the first floating diffusion layer and the second floating diffusion layer are disposed laterally between the first transfer gate and the second transfer gate, and wherein the first transfer gate and the second transfer gate are coupled to transfer the image charge from the first photodiode and the second photodiode to the second floating diffusion layer;
a gate oxide layer in surrounding relationship with the first transfer gate and the second transfer gate; and
first and second sidewall spacers formed on the second floating diffusion layer and further positioned against the gate oxide layer, and wherein the second floating diffusion layer is disposed between the first floating diffusion layer and the first and the second sidewall spacers.

15. The pixel cell of claim 14, wherein the second floating diffusion layer has a thickness, the thickness of the second floating diffusion layer being configurable to modulate a conversion gain of the pixel cell.

16. The pixel cell of claim 14, wherein at least one of the first floating diffusion layer or the second floating diffusion layer is an epitaxial growth layer.

17. The pixel cell of claim 14, wherein the first floating diffusion layer has a portion disposed in the semiconductor substrate and a portion disposed above the front surface of the semiconductor substrate.

18. The pixel cell of claim 14, wherein the first floating diffusion layer is undoped.

19. The pixel cell of claim 14, wherein the first floating diffusion layer is of the second conductivity type, the first floating diffusion layer being doped with a dosage level less than a dosage level of the second floating diffusion layer.

20. The pixel cell of claim 14, further comprising first and second buried channel dopant regions disposed in the doped well region of the semiconductor substrate, wherein the first and the second buried channel dopant regions are respectively positioned beneath the first transfer gate and the second transfer gate, respectively, and beneath a portion of the floating diffusion, the first and the second buried channel dopant regions having the second conductivity type for respectively forming a first channel region and a second channel region to respectively transfer the image charge from the first photodiode and the second photodiode to the floating diffusion.

* * * * *